US010796871B2

(12) United States Patent
Maier et al.

(10) Patent No.: US 10,796,871 B2
(45) Date of Patent: Oct. 6, 2020

(54) ELECTRIC SWITCH

(71) Applicant: Marquardt GmbH, Rietheim-Weilheim (DE)

(72) Inventors: Andreas Maier, Fluorn-Winzeln (DE); August Geiger, Talheim (DE); Alexander Hentschel, Dunnningen-Seedorf (DE); Alexander Prill, Villingen-Schwenningen (DE); Daniel Nill, Spaichingen (DE)

(73) Assignee: Marquardt GmbH, Rietheim-Weilheim (DE)

( * ) Notice: Subject to any disclaimer, the term of this patent is extended or adjusted under 35 U.S.C. 154(b) by 42 days.

(21) Appl. No.: 16/294,093

(22) Filed: Mar. 6, 2019

(65) Prior Publication Data

US 2019/0206647 A1 Jul. 4, 2019

Related U.S. Application Data

(60) Division of application No. 14/533,413, filed on Nov. 5, 2014, now Pat. No. 10,319,547, which is a
(Continued)

(30) Foreign Application Priority Data

May 15, 2012 (DE) .................. 10 2012 009 574

(51) Int. Cl.
*H01H 9/20* (2006.01)
*H01H 50/24* (2006.01)
(Continued)

(52) U.S. Cl.
CPC ......... *H01H 50/24* (2013.01); *G01R 31/3278* (2013.01); *H01H 23/006* (2013.01);
(Continued)

(58) Field of Classification Search
CPC .... H01H 23/006; H01H 23/105; H01H 23/22; H01H 7/14; H01H 2219/026
See application file for complete search history.

(56) References Cited

U.S. PATENT DOCUMENTS 3,684,850 A     8/1972  Kaderbek et al.
3,842,375 A  * 10/1974  Collette ................. H01H 3/503
                                                       335/164
(Continued)

FOREIGN PATENT DOCUMENTS

CN        1192571 A     9/1998
CN      102257587 A    11/2011
(Continued)

OTHER PUBLICATIONS

German Search Report (Application No. 10 2012 009 574.0) dated Feb. 5, 2013.
(Continued)

*Primary Examiner* — Alexander Talpalatski
(74) *Attorney, Agent, or Firm* — Burr & Brown, PLLC

(57) ABSTRACT

The invention relates to an electric switch, in particular a rocker switch, comprising a contact system and comprising a movable actuating element for switching over the contact system between two switch positions, in particular an on position and an off position. The switch has a drivable actuator, which is operatively connected to the actuating element in such a way that the actuating element in at least one of the two switch positions is moved, on driving of the actuator, into the other switch position by the actuator for switching the contact system. In particular, the actuating element is moved by the actuator from the on position to the off position of the contact system.

1 Claim, 11 Drawing Sheets

Related U.S. Application Data continuation of application No. PCT/EP2013/001405, filed on May 14, 2013.

(51) Int. Cl.
*H01H 23/00* (2006.01)
*H01H 23/10* (2006.01)
*H01H 23/22* (2006.01)
*H01H 51/00* (2006.01)
*G01R 31/327* (2006.01)
*H01H 50/02* (2006.01)
*H01H 50/44* (2006.01)
*H01H 50/64* (2006.01)

(52) U.S. Cl.
CPC .......... *H01H 23/105* (2013.01); *H01H 23/22* (2013.01); *H01H 50/02* (2013.01); *H01H 50/44* (2013.01); *H01H 50/643* (2013.01); *H01H 51/00* (2013.01)

(56) References Cited

U.S. PATENT DOCUMENTS

| | | | |
|---|---|---|---|
| 4,276,483 A | 6/1981 | Hayden | |
| 4,329,669 A * | 5/1982 | Krasser | H01H 83/12 335/20 |
| 4,370,565 A | 1/1983 | Hayden | |
| 4,623,861 A * | 11/1986 | Krasij | H01H 71/54 200/303 |
| 4,628,288 A * | 12/1986 | Fujihisa | H01H 71/526 200/401 |
| 5,525,948 A * | 6/1996 | Poulsen | H01H 3/503 335/128 |
| 6,714,108 B1 * | 3/2004 | Simms | H01H 3/001 200/240 |
| 6,958,895 B1 * | 10/2005 | Radosavljevic | H01H 3/001 335/15 |
| 7,378,927 B2 * | 5/2008 | DiSalvo | H01H 71/62 335/18 |
| 7,566,841 B2 * | 7/2009 | McCoy | H01H 50/002 200/331 |
| 7,868,719 B2 * | 1/2011 | Bazayev | H01H 9/0264 200/43.16 |
| 7,999,200 B2 * | 8/2011 | Komori | H01H 3/161 200/324 |
| 8,169,282 B2 * | 5/2012 | Kiyono | H01H 23/205 335/179 |
| 8,952,771 B2 * | 2/2015 | Kiyono | H01H 23/205 335/128 |
| 2005/0275995 A1 * | 12/2005 | Noguchi | H01H 83/02 361/160 |
| 2006/0125583 A1 * | 6/2006 | Mills | H01H 71/123 335/172 |
| 2011/0141647 A1 | 6/2011 | Garcia et al. | |
| 2011/0227692 A1 | 9/2011 | Schwabenland | |

FOREIGN PATENT DOCUMENTS

| | | |
|---|---|---|
| CN | 102347160 A | 2/2012 |
| DE | 29 28 031 A1 | 1/1981 |
| DE | 29 28 277 A1 | 1/1981 |
| DE | 198 02 332 A1 | 7/1998 |
| DE | 10 2006 006 409 A1 | 8/2007 |
| EP | 0 537 700 A1 | 4/1993 |
| JP | 2000-164076 A | 6/2000 |
| WO | 2010/069392 A1 | 6/2010 |

OTHER PUBLICATIONS

International Search Report and Written Opinion (Application No. PCT/EP2013/001405) dated Aug. 16, 2013.
International Preliminary Report on Patentability (Application No. PCT/EP2013/001405) dated Nov. 27, 2014.
Chinese Office Action and Search Report (Application No. 201380025301.3) dated Dec. 31, 2015 (with English translation).
Chinese Office Action (Application No. 201380025301.3) dated Sep. 28, 2016 (with English translation).
European Office Action (Application No. 13 725 068.4) dated Aug. 14, 2017.
European Office Action (Application No. 13 725 068.4) dated Jun. 22, 2018.

* cited by examiner

Terminal pin assignment

Schematic

Description of functionality

AOS-I

Terminal pin assignment

Assembly
Module complete

Schematic

ELECTRIC SWITCH

CROSS REFERENCE TO RELATED APPLICATIONS

This application is a division of U.S. application Ser. No. 14/533,413, filed Nov. 5, 2014, which in turn is a continuation of International Application No. PCT/EP2013/001405 filed May 14, 2013, which designated the United States, and claims the benefit under 35 USC § 119(a)-(d) of German Application No. 10 2012 009 574.0 filed May 15, 2012, the entireties of which are incorporated herein by reference.

FIELD OF THE INVENTION

The invention relates to an electric switch.

BACKGROUND OF THE INVENTION

Such electric switches are used for switching on and/or switching off electrical appliances by manual actuation by a user. In particular, these switches are used, for example, in the domestic appliance industry for domestic appliances such as coffee machines, vacuum cleaners or the like, for appliances in the entertainment industry etc. Such switches can be configured in the fashion of a toggle switch.

Such an electric switch can have a housing. A contact system is located in the housing. A movable actuating element for switching over the contact system between two switch positions, namely an off position and an on position, protrudes out of the housing. The switch remains in the on position once it has been switched on and can only be switched off by renewed manual actuation of the actuating element.

SUMMARY OF THE INVENTION

The present invention is based on the problem of developing the switch in such a way that the switch is additionally switchable non-manually from one switch position to the other switch position. In particular, such a toggle switch is intended to be capable of being switched over both mechanically, i.e. manually by the user, and electrically/electronically, i.e. without any manual intervention.

In the case of the electric switch according to the present invention, a drivable actuator is provided, which is operatively connected to the actuating element. As a result, the actuating element in at least one of the two switch positions is moved, on driving of the actuator, into the other switch position by the actuator for switching the contact system. In particular, the actuating element is moved by the actuator from the on position to the off position of the contact system. Therefore, the switch is at least capable of being switched off "electrically/electronically".

Preferably, the actuator is an electromagnet having a coil and an armature. The operative connection between the actuator and the actuating element can be effected by means of the armature, which results in a particularly compact configuration. For this purpose, the armature can act in a particularly simple manner, by means of a plunger, on the actuating element, to be precise preferably on a lip on the actuating element.

In order to protect the switch from damaging influences, the switch can expediently have a housing. The contact system is located in the housing. The actuating element protrudes out of the housing such that it is accessible to the user. Expediently, the actuator is located in the housing. In order to be able to switch off an electrical appliance automatically after a certain time, for example in which the electrical appliance is in the standby mode, the switch can have programmable electronics, which in particular comprise a timer, for moving the actuating element into the other switch position of the contact system in a controlled manner. Expediently, the electronics are arranged on a printed circuit board located in the housing. For example, in the standby mode the timer can then be set in motion in order to switch off a coffee machine after a certain time. In a particularly flexible manner, the electronics have, for this purpose, a microcontroller, wherein a time span, in particular in the fashion of a disconnection time, is programmable. On elapse of the time span, the electronics drive the actuator for switching the contact system, i.e., for example, the coffee machine is switched off automatically once the pre-programmed time has elapsed.

With the aid of the switch according to the present invention, an electrical appliance can be switched off automatically after a defined time. As a result, energy, in particular that for the standby mode of the electrical appliance, is saved. The switch according to the invention therefore advantageously realizes an "ECO" switch for energy saving.

The purpose of testing the function of the switch, in a further configuration the electronics can be operable in a test mode for driving the actuator. For this purpose, the mains frequency of the supply voltage can be used as an indicator for changeover to the test mode. For example, the electronics change over to the test mode when a mains frequency is identified which does not correspond to the usual mains frequencies of 50 Hz or 60 Hz and has a defined value. If the electronics then identify a usual mains frequency, the action for the test mode is then activated. With this action, the switch is switched over in particular prior to elapse of the time span, for example, the switch is switched off immediately, whereby the functionality of the switch can be established without waiting for the length of the disconnection time.

For a particularly preferred configuration of such a switch in which the use of a specific mains frequency of the supply voltage as indicator of the changeover to the test mode takes place, the following needs to be established.

Problem

In the assembled state, a switch which is programmed to a specific disconnection time cannot be switched off automatically prematurely. In order to safeguard the functionality, the predefined time needs to be waited. In order to shorten the wait time, a test mode can be implemented which can be activated by presetting a clear signal.

Solution

In general, the mains frequency of the supply voltage is used as indicator for changeover to the test mode. In order that no disadvantages arise as a result of the operation of the application at the indicator frequency, the action is only started once the indicator frequency has been left.

In the given case, the frequency of the mains voltage is evaluated after every hardware reset. The measurement takes place by means of a phase detector. If a mains frequency is identified which does not correspond to the usual mains frequencies (50 Hz or 60 Hz) and has a defined value, the electronics change over to the test mode. At the instant at which the microcontroller identifies a usual mains frequency again, the action of the test mode is activated, i.e. the switch is switched off immediately.

Advance, Advantages

1. It is not necessary for contact to be made with the electronics for the realization of a clear indicator.
2. Implementing the indicator is associated with a certain degree of complexity. At the same time, this circumstance makes the indicator very clear and the application equipped therewith safe.
3. No additional interface is required. This is highly favorable when implementing applications with large batch sizes.
4. The customer can check the switch on the assembly line, to be precise in the assembly clock, in the terminal.

In a further configuration, after assembly first the test mode can be set at the switch. For this, the printed circuit board can have a lug, by means of which the electronics are operated in an initially provided operating mode, to be precise in particular in the test mode. If the functionality of the switch has then tested positive, the electronics can be operated in another operating mode by the lug being at least partially removed. In particular, then the test mode is ended and the switch is operated in its conventionally provided operating mode. For the purpose of simple removal of the lug, the lug can be passed to the outside through a slot in the housing. It can then be provided that, once that part of the lug which protrudes out of the housing slot has been removed, which can be performed by breaking off the lug at the housing slot, for example, the rest of the lug acts as closure for the housing slot. This ensures that the ingress of damaging external influences into the housing is effectively prevented.

For simple programming of the disconnection time in the electrical switch, in a further configuration the printed circuit board can have a programming lug. The programming lug is expediently passed to the outside through a slot in the housing. As a result, the programming and/or final inspection of the switch is made possible by means of contact-making points on the programming lug. The programming lug can be perforated at the housing outlet, with the result that the programming lug can be broken off in a simple manner after completion. The rest of the remaining programming lug can be used as closure for the housing slot, whereby the ingress of harmful substances into the housing is prevented.

For a particularly preferred configuration of such an electronic switch comprising a programming lug, the following should be established.

Problem

The auto-off switches (AOS) are provided with different off times depending on customer requirements. The time should be installed only on the finished product owing to an optimized manufacturing process. In addition, it is necessary for contact to be made with the printed circuit board during the final inspection (EOLT). When finding a solution, it is necessary to also take into consideration the protection class of the switch.

Solution

The printed circuit board is provided with a programming lug which is passed to the outside through a slot in the housing. The necessary contact-making points for the programming and the final inspection are located on the lug. The lug is perforated at the housing outlet, with the result that the lug can be broken off after completion as "good identification". The rest of the lug is used in this case as closure for the housing slot, i.e. the protection class can be adhered to without any additional part.

Advance, Advantages

The switches according to the invention can be designed to be "neutral" on the assembly line. The customer-specific assignment (formation of variants) only takes place in the last working step, namely the programming.

In a further configuration, it may be possible for the actuator to be driven at least one further time in the case of faulty non-completion of the switchover of the contact system to the other switch position. In this case, a time which is matched to the cooling response of the actuator can be waited between the drive pulses for the actuator before the control pulse for the next driving is initiated again. After a defined number of faulty drive attempts, however, expediently the function of the drivable switchover can be deactivated.

For a particularly preferred configuration of such a switch which has a disconnection safety device in the case of a stuck rocker is to be established below.

Problem

The automatic disconnection of the switch takes place by virtue of an armature which is in turn driven by an electromagnet. Owing to the technical configuration, the switch-off force is limited. This means that when the rocker is prevented from switching off, the switch remains switched on and, under certain circumstances, the product would thus be damaged thereby, namely the coil would burn out.

Solution

In the event of failed automatic switching off, the switch is driven again. A time which is matched to the cooling response of the coil is waited between the drive pulses before a control pulse is initiated again. If, after the defined number of "switch-off attempts", the switch should still be switched on, the auto-off function is deactivated. Thereafter, the switch needs to be brought into the off position manually.

Advance, Advantages

1. Ensuring the greatest possible functionality with at the same time functional safety.
2. The customer can use the switch as a "normal" on/off switch in the event of non-functioning disconnection.

In a further configuration, the load circuit of the switch is isolated from the drive circuit of the actuator. In this case, the drive circuit can be operated by means of a low voltage. An optocoupler can be used for the isolation.

For a particularly preferred configuration of such a switch which implements a low-voltage variant in the switch program, the following needs to be established.

Problem

Isolation of load and drive circuits in the case of the auto-off switch (AOS). The driving of the switch by the customer should take place at a low voltage. The external dimensions of the switch family should not be negatively influenced thereby.

Solution

The isolation is achieved by virtue of the use of an optocoupler. The division between the printed circuit board and the placement of the component part and the passing of the connection to the outside makes it possible to accommodate the circuit in the defined installation volume.

Advance, Advantages

The customer can construct or design the machine at less expense when using the low-voltage variant. For example, no ground contact on the mains plug is required.

In a further configuration, the electronics have a fuse in the event of an overload and/or a fault. The fuse can be integrated as a fuse section in a simple manner, to be precise if desired directly in the printed circuit board layout of the printed circuit board. The fuse section can be guided in the plane and/or in three dimensions over the printed circuit board thickness in the printed circuit board.

For a particularly preferred configuration of such a switch comprising a fuse section, the following is to be established.

Problem

In the event of an overload and/or a fault, for example a transistor breaking down, the possibility of a fire caused by the electronics needs to be ruled out. Owing to the price pressure, no additional costs should be accrued.

Solution

A fuse section is integrated in the printed circuit board layout. In order to implement the response times taking into consideration the limit current, the section is guided not only in the plane but also in three dimensions, i.e. in the printed circuit board thickness. Using contours, cross sections and/or additional bores, a temperature drop is produced which results in mechanical stresses in the fuse section, and the fuse section rips apart in the event of an overload. One advantage when using the through-plating consists in that the layer can be designed to be thinner in terms of processing technology and the heating in the "via" can be set more quickly.

Advance, Advantages

Product safety without additional costs.

In a further configuration, a means for measuring the electric current flowing through the switch is provided. The current measurement means can comprise a resistor, which in turn in particular consists of a meandering path at an electrical terminal of the switch. If necessary, the current measurement means can furthermore comprise an amplifier and possibly a comparator.

For a particularly preferred configuration of such a switch in which the measurement of an alternating current is enabled with the aid of a comparator, the following is to be established.

Problem

A feature of the AOS+I switch family (auto-off switch with current identification) is the independent identification of the operating modes and of responses corresponding to the customer's requirements. The identification of the operating modes is performed by the reading and interpretation of the working current. The current flow results in a small voltage drop across the meandering resistor, which can be in the form of a stamped part. The resistance value of the meander cannot be increased owing to a simultaneous increase in the heating. The following problem is thus set:
1. An amplifier with a high gain which produces a stable output signal even in the event of severely fluctuating environmental influences is required.
2. An inexpensive and current-saving analog-to-digital converter which has a high resolution even at low amplitudes is required.

Solution

The solution by means of hardware is provided by the use of a current mirror, which has two outputs with different properties, to be precise
1. a current-independent reference output (K1) and
2. a transimpedance amplifier, which is constructed from a meander and an amplifier (K2).

Environmental influencing variables, for example temperature influences, are compensated for by the symmetrical design of the two outputs. A current flow through the meandering resistor effects a periodic crossover of the signal K2 with the reference signal K1 above a certain current amplitude. Both signals are supplied to a comparator, which changes its output value on each crossover of the signals. The result is a PWM (Pulse Width Modulation) signal.

The solution by means of software takes into consideration the following. If the waveform of the current is known, to be precise generally a sinusoidal signal, the current amplitude can be clearly determined from the duty cycle $\lambda$ of the PWM signal. The mathematical relationship can be stored either directly in the software or a conclusion can be drawn in respect of the current amplitude by means of an assignment table.

Advance, Advantages

1. True and precise current measurement in the case of knowledge of the current waveform is made possible.
2. Robust in respect of environmental interference variables.
3. No analog-to-digital converter and therefore a reduction in the amount of current required. This is absolutely necessary in particular when using resistive switched mode power supplies.
4. Inexpensive implementation of a precise current measurement.

BRIEF DESCRIPTION OF THE DRAWINGS

Exemplary embodiments of the invention with various developments and configurations are illustrated in the drawings and described in more detail below.

DETAILED DESCRIPTION OF THE INVENTION

Figure 1:
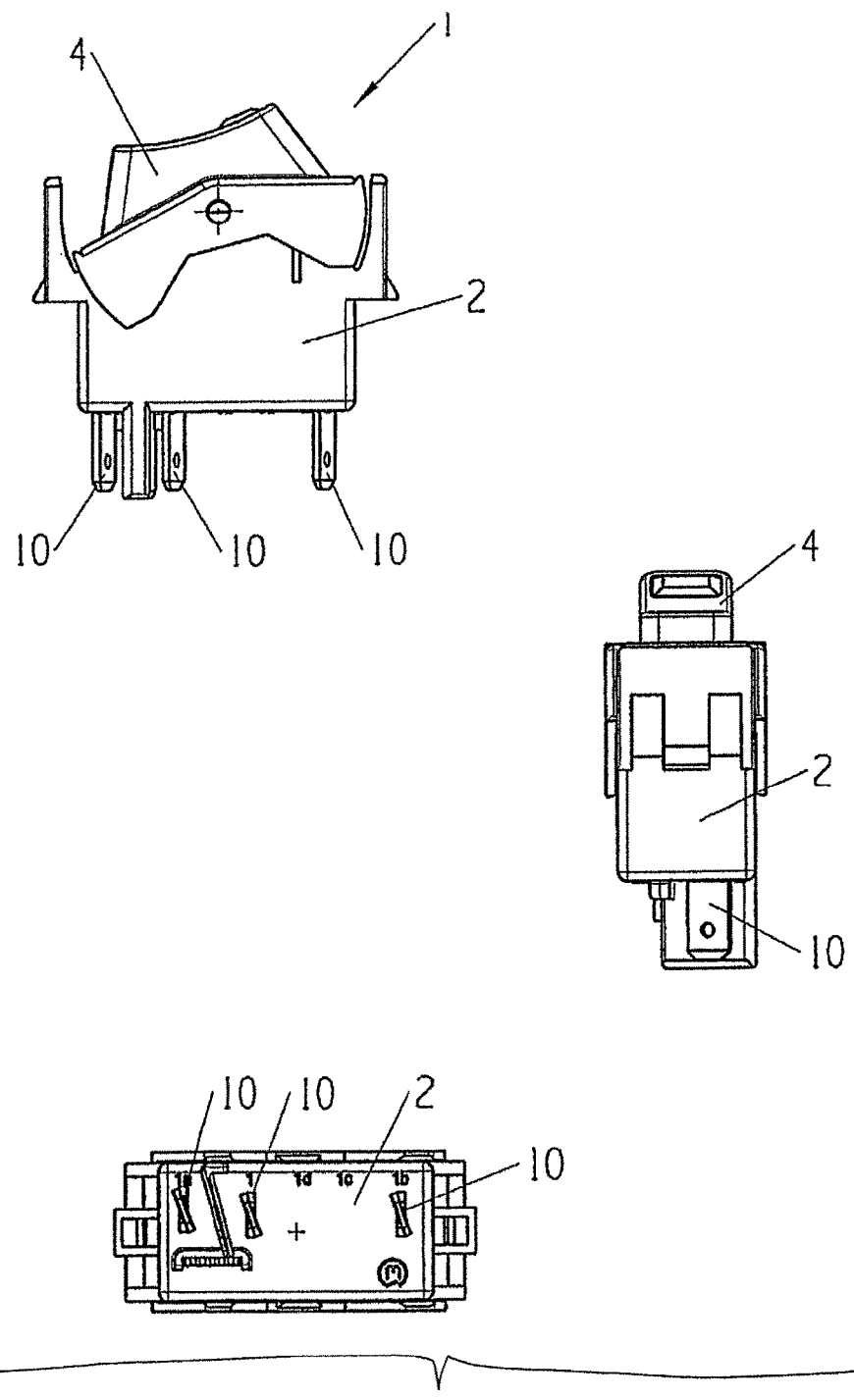
FIG. 1 shows an electric switch in a side view, a front view and a view from below.
Figure 2:
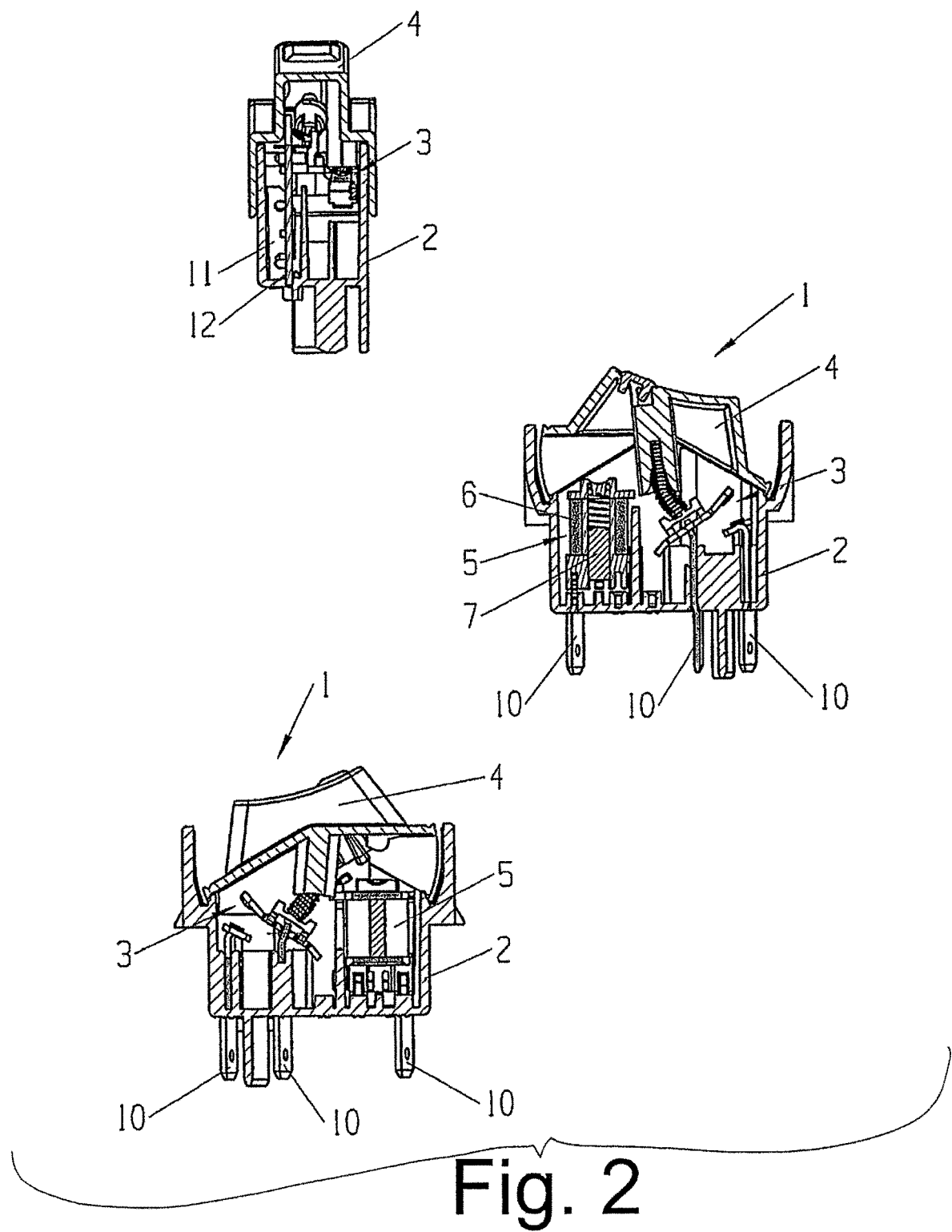
FIG. 2 shows various sections through the electric switch shown in FIG. 1.
Figure 3:
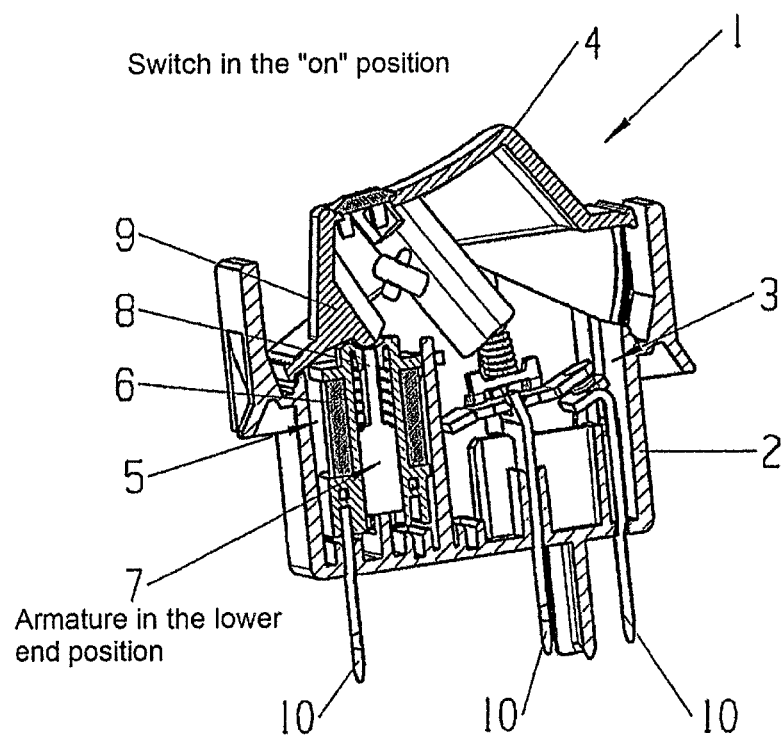
FIG. 3 shows the switch from FIG. 1 with the housing open, wherein the switch is in the on position.

FIG. 1 shows an electric switch 1 in the form of a rocker switch. The switch 1 has a housing 2. A contact system 3, as can be seen in FIG. 2, is located in the interior of the housing 2. In order to supply the electric voltage to the contact system 3, electrical terminals 10 protrude out of the housing 2. The switch 1 also has a movable actuating element 4, which is in this case in the form of a rocker, for manually switching over the contact system 3 between two switch positions, namely an on position (shown in FIG. 3) and an off position (shown in FIG. 5). Finally, a drivable actuator 5 is also located in the housing 2, which drivable actuator is operatively connected to the actuating element 4, as shown in FIG. 3, in such a way that the actuating element 4 in at least one of the two switch positions is moved, on driving of the actuator 5, into the other switch position by the actuator 5 for switching the contact system 3. In particular, the switch 1 is a self-disconnectable switch, with the result that the actuating element 4 is moved by the actuator 5 from the on position to the off position of the contact system 3.

Figure 4:
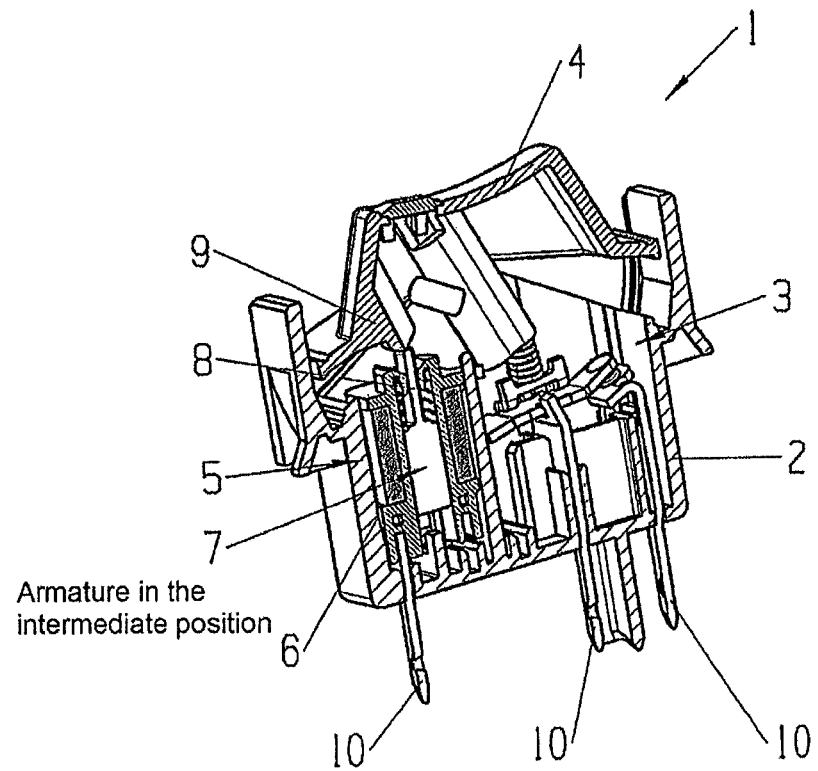
FIG. 4 shows the switch as in FIG. 3, wherein the switch is in an intermediate position during the switch-off operation.
Figure 5:
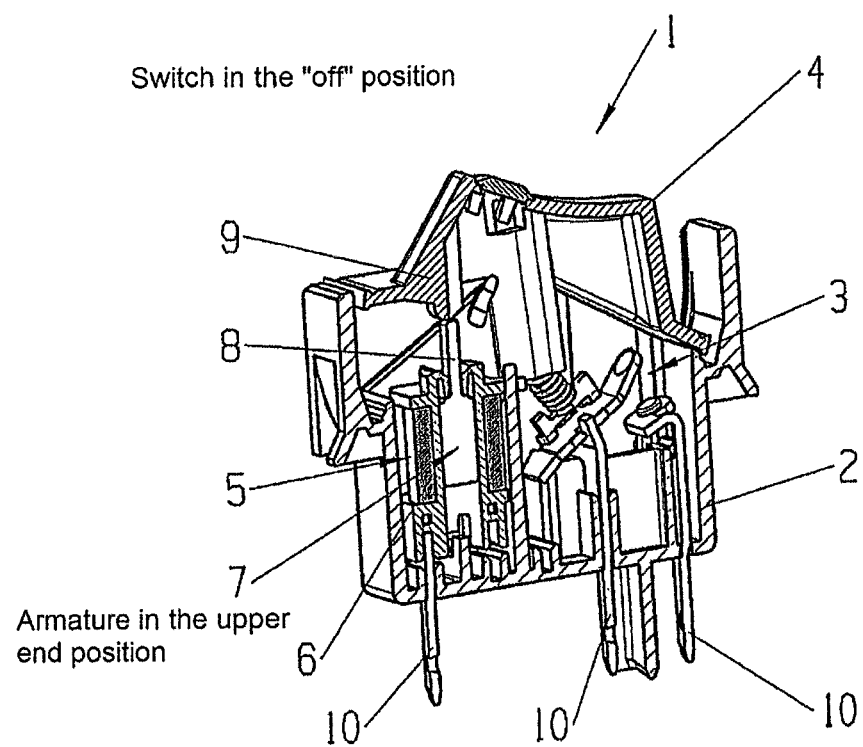
FIG. 5 shows the switch as in FIG. 3, wherein the switch is in the off position.

As can be seen with reference to FIG. 2, the actuator 5 is an electromagnet having a coil 6 and an armature 7. The operative connection between the actuator 5 and the actuating element 4 is effected by means of the armature 7. For this purpose, the armature 7 acts on a lip 9 on the actuating element 4 by means of a plunger 8, as can be seen from the switch-off operation during self-disconnection as shown in FIG. 3 to FIG. 5. The schematic together with the terminal assignment for the self-disconnecting switch 1 having the actuator 5 can be seen in more detail in FIG. 6.

The switch 1 has programmable electronics 11, as can be seen in FIG. 2. The electronics 11 are arranged on a printed circuit board 12 located in the housing 2. The electronics 11 comprise a timer for moving the actuating element 4 into the other switching position of the contact system 3 in a controller manner. For this purpose, the electronics 11 have a microcontroller, wherein a time span is programmable in the fashion of a disconnection time in the microcontroller in such a way that the electronics 11 drive the actuator 5 for switching the contact system 3 once the time span has elapsed.

Figure 7:
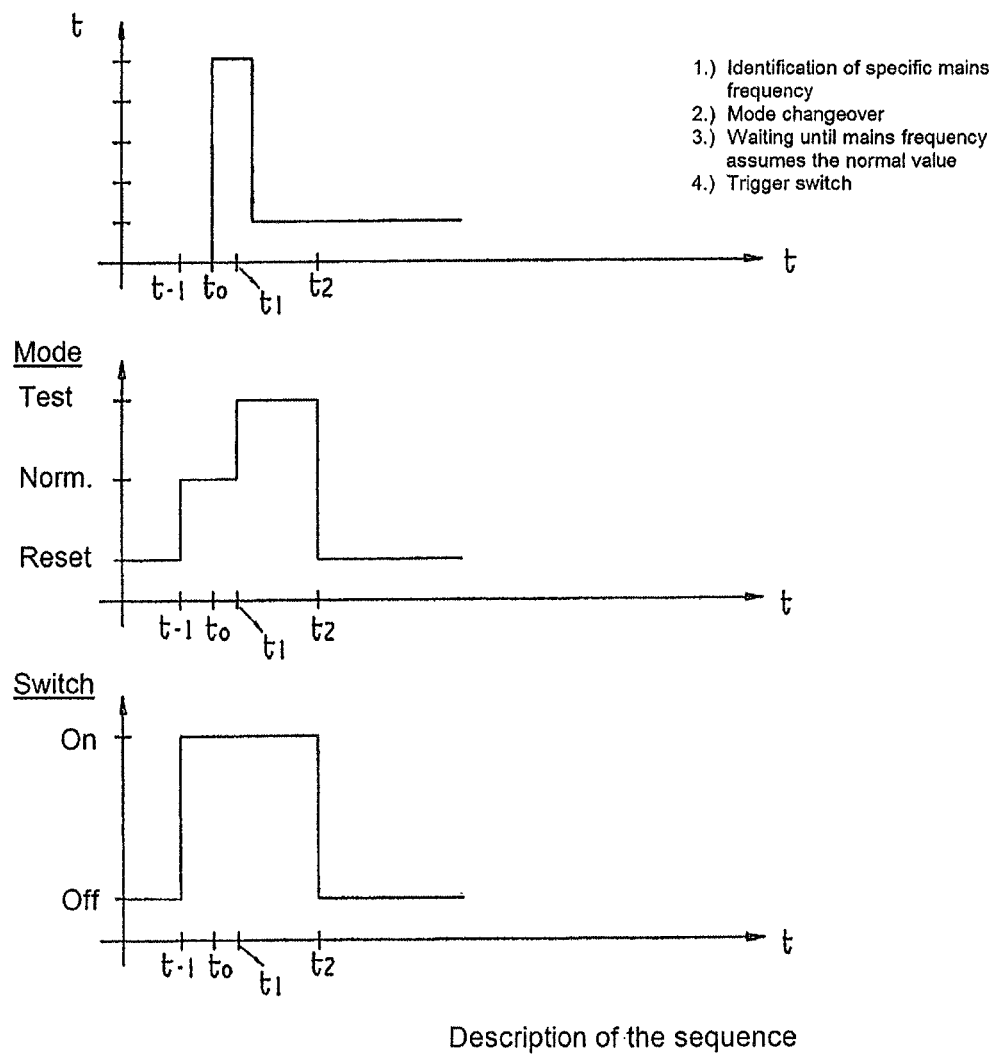
FIG. 7 shows the functional sequence for the switch in accordance with a further embodiment.

In accordance with one embodiment of the switch 1, the electronics 11 are operable in a test mode for the driving of the actuator 5 in order thus to be able to test the functionality of the self-disconnection of the switch 1 without any time delay. For this purpose, the mains frequency of the supply voltage is used as an indicator for the changeover to the test mode, as is shown in FIG. 7. If a mains frequency is identified which does not correspond to the usual mains frequencies, i.e. 50 Hz or 60 Hz, and has a defined value, the electronics 11 change over to the test mode. When the electronics 11 then identify a usual mains frequency, the action of the test mode is activated, preferably the switch 1 is immediately switched off by means of driving of the actuator 5 in the event of this action.

Figure 8:
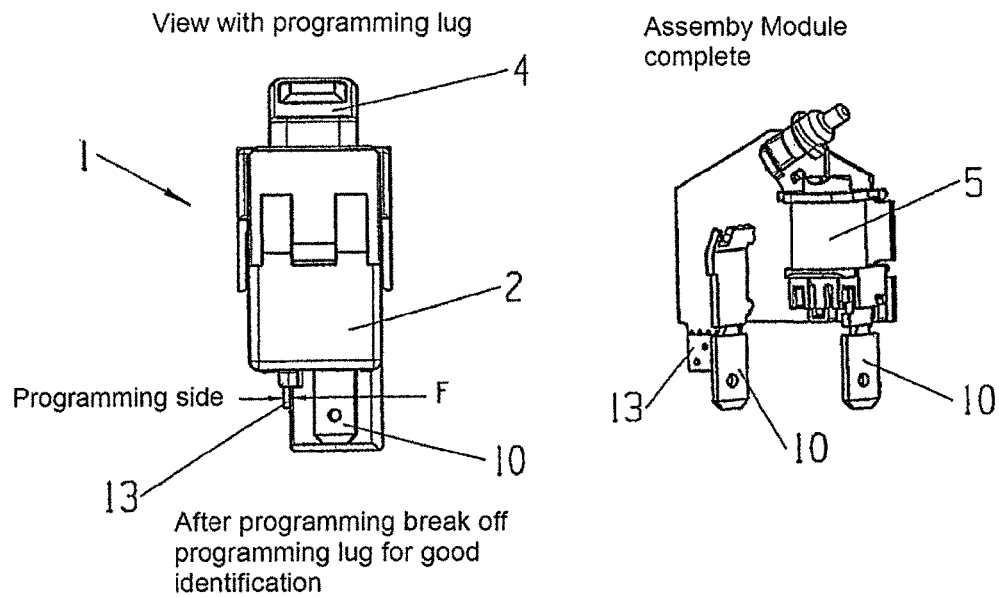
FIG. 8 shows various views of the switch in accordance with yet a further embodiment.
Figure 8:
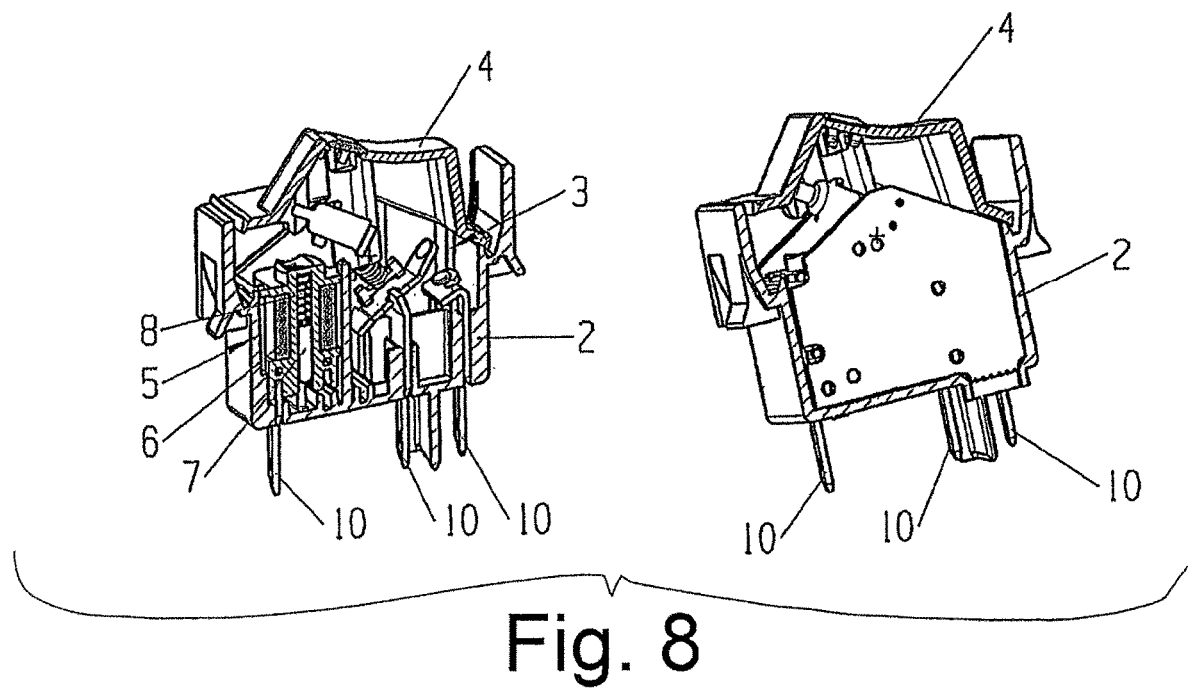

In accordance with a further embodiment of the switch 1, which is shown in FIG. 8, the printed circuit board 12 has a programming lug 13. The programming lug 13 is passed to the outside through a slot in the housing 2 in such a way that the programming and/or final inspection of the switch 1 during manufacture thereof is made possible by means of contact-making points on the programming lug 13. The programming lug 13 is perforated at the housing outlet in such a way that the programming lug can be broken off after completion. In this case, the rest of the programming lug 13 located in the slot is then used as closure for the housing slot. It is also possible to use only a simple lug 13 instead of a programming lug, which simple lug, when provided, operates the switch 1 in the test mode and, when not present, ends the test mode for the switch 1 and operates the switch 1 in the "usual" operating mode thereof. The removal of that part of the lug 13 which protrudes out of the housing slot can be performed, for example, by it being broken off, with the result that the remaining part of the lug 13 closes the housing slot.

Figure 9:
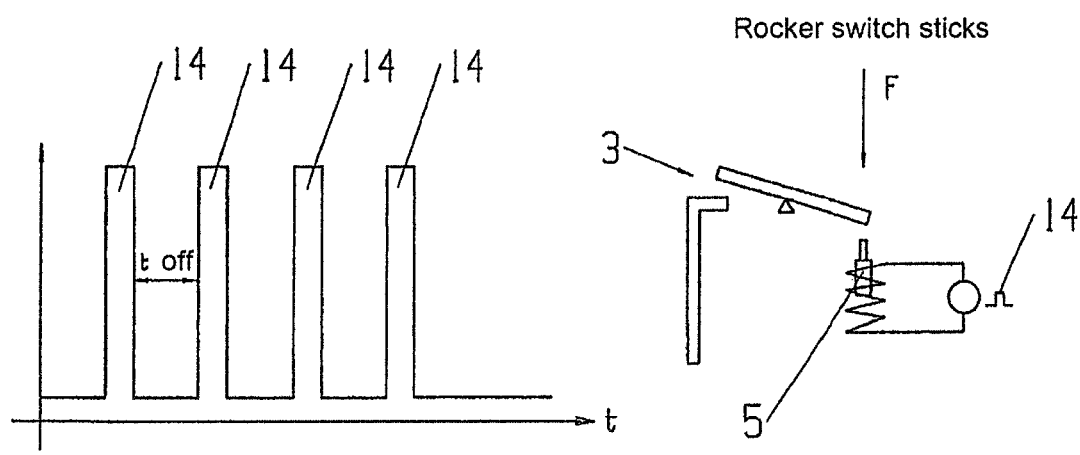
FIG. 9 shows the functional sequence for the switch in accordance with yet a further embodiment.

In the event of faulty non-completion of the switchover of the contact system 3 into the other switch position, which can occur in the case of a stuck actuating element 4, for example, the actuator 5 is driven at least one further time. In order, however, to avoid an overload of the actuator 5, a time which is matched to the cooling response of the actuator 5 is waited between the drive pulses 14 for the actuator 5 before the control pulse 14 for the next driving is initiated again, as can be seen in FIG. 9. After a predefined number of faulty drive attempts, the function of the drivable switchover is deactivated. In this case, the switch 1 can only be disconnected manually by the user by moving the actuating element 4.

Figure 6:
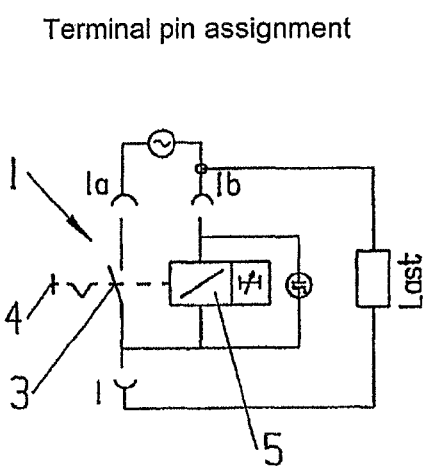
FIG. 6 shows a schematic for the connection of the electric switch.
Figure 6:
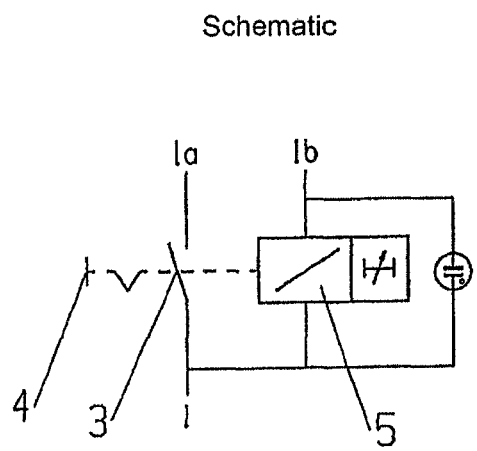

As can be seen from FIG. 6, the load circuit for the switch 1 and the drive circuit for the actuator 5 are operated on the same voltage. In a further embodiment, which is not illustrated in any more detail, however, the load circuit of the switch 1 is isolated from the drive circuit of the actuator 5. As a result, the drive circuit can then be operated by means of a low voltage. An optocoupler can be used to isolate the load and drive circuits.

In a further embodiment, which is likewise not illustrated in any more detail, the electronics 11 can be provided with a fuse for the event of an overload and/or a fault. The fuse is integrated as a fuse section in the layout of the printed circuit board 12. For this purpose, the fuse section is guided in the plane of the printed circuit board 12 and/or in three dimensions in the printed circuit board 12 using the printed circuit board thickness.

Figure 10:
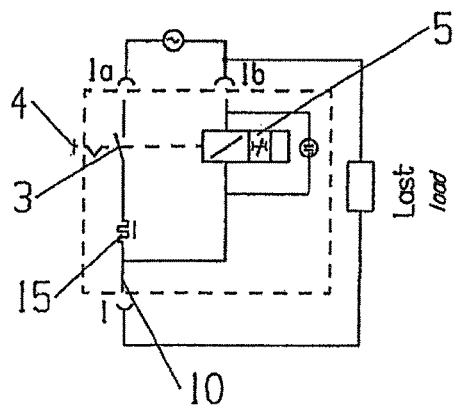
FIG. 10 shows various views of the switch with a schematic in accordance with yet a further embodiment.
Figure 10:
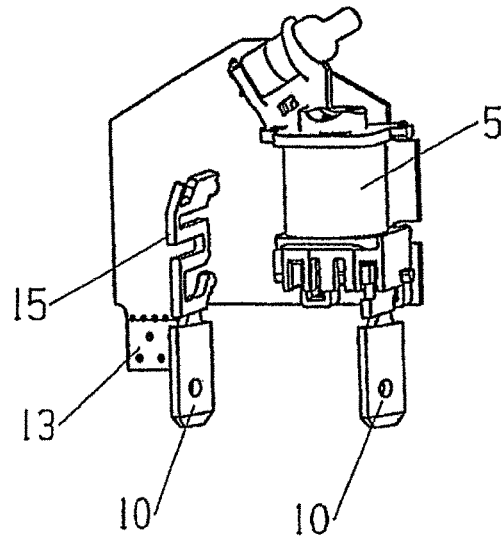
Figure 10:
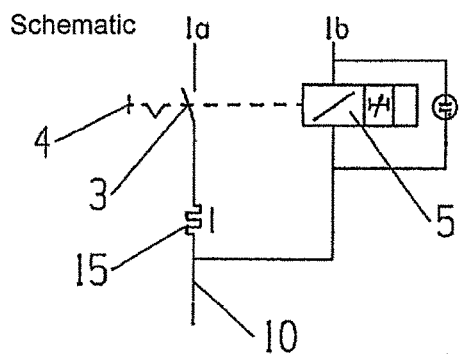
Figure 10:
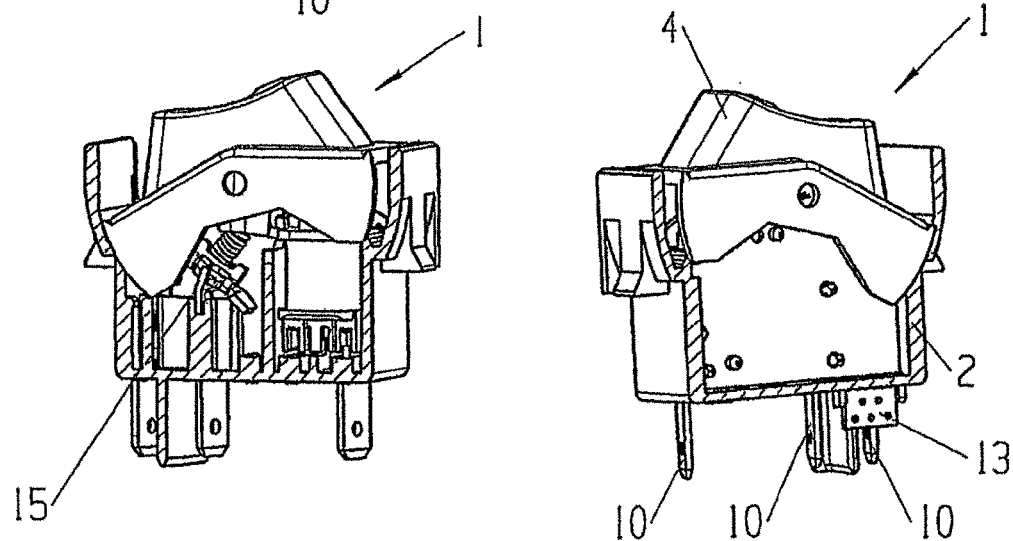
Figure 11:
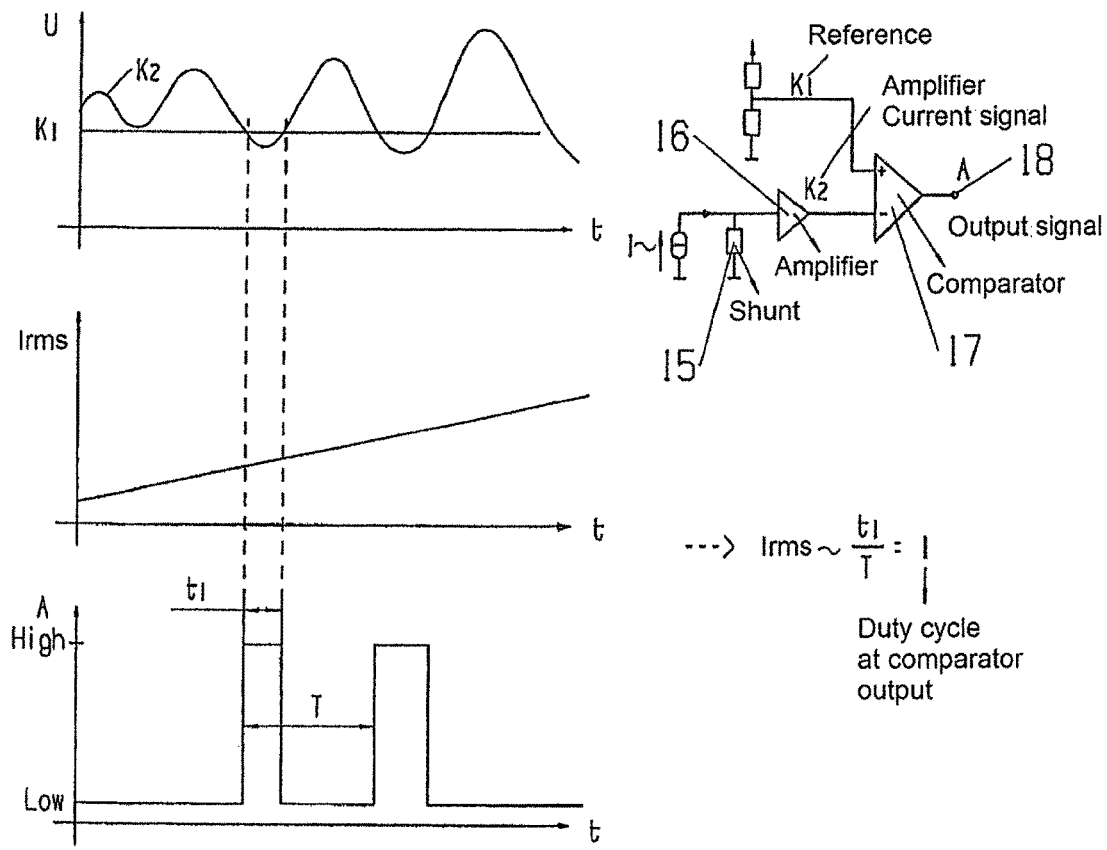
FIG. 11 shows the schematic and the functional sequence for the switch in accordance with yet a further embodiment.

In a further embodiment, which is shown in FIG. 10 and FIG. 11, a means for measuring the electric current flowing through the switch 1 is provided. This current measurement means comprises a resistor 15, an amplifier 16 and a comparator 17. The resistor 15 is in the form of a meandering path at one electrical terminal 10, as shown in FIG. 10. As can furthermore be seen from FIG. 11, the magnitude of the measured current is output as duty cycle in the manner of a pulse-width signal at the output 18 of the comparator 17.

The invention is not restricted to the exemplary embodiments described and illustrated. Instead, it also includes all developments that a person skilled in the art can perform within the scope of the invention defined by the patent claims. Thus, such an electric switch 1 can be used not only for coffee machines but also in other electrical appliances in which automatic switchover and/or switching off is intended to be made possible, and in other domestic appliances, garden appliances, electric tools, or the like.

LIST OF REFERENCE SYMBOLS

1: (Electric) switch
2: Housing
3: Contact system
4: Actuating element
5: Actuator
6: Coil
7: Armature
8: Plunger
9: Lip (on actuating element)
10: (Electrical) terminal
11: Electronics
12: Printed circuit board
13: Programming lug/lug
14: Drive pulse/control pulse
15: Resistor
16: Amplifier
17: Comparator
18: Output (of comparator)

The invention claimed is:

1. An electric switch comprising a contact system; a movable actuating element for switching over the contact system between two switch positions; and a drivable actuator, which is operatively connected to the actuating element such that the actuating element in at least one of the two positions is moved, on driving the actuator, into the other switch position by the actuator for switching the contact system, wherein the actuator is an electromagnet having a coil and an armature such that the operative connection between the actuator and the actuating element is effected by the armature, wherein the actuating element is moved by the actuator into the other switch position by acting of the armature via a plunger on a lip on the actuating element, wherein the switch has a housing, the actuator and electronics are located in the housing, the electronics are programmable electronics, which are arranged on a printed circuit board located in the housing, wherein the printed circuit board has one of (i) a lug, by which the electronics are operated in an operating mode, and by at least partially removing the lug, the electronics are operated in another operation mode, such that the operation mode is a test mode and in the another operation mode the test mode is ended, or (ii) a programming lug, with contact-making points on the programming lug, and wherein one of final inspection, or programming of the switch is made possible.

* * * * *